(12) United States Patent
Toba

(10) Patent No.: US 8,921,227 B2
(45) Date of Patent: Dec. 30, 2014

(54) SEMICONDUCTOR DEVICE ASSEMBLY AND SEMICONDUCTOR DEVICE AND METHOD OF MANUFACTURING THE SAME

(71) Applicant: Dowa Electronics Materials Co., Ltd., Tokyo (JP)

(72) Inventor: Ryuichi Toba, Akita (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 18 days.

(21) Appl. No.: 13/895,472

(22) Filed: May 16, 2013

(65) Prior Publication Data

US 2013/0307133 A1   Nov. 21, 2013

(30) Foreign Application Priority Data

May 16, 2012   (JP) .................. 2012-112680

(51) Int. Cl.
*H01L 21/48*   (2006.01)
*H01L 23/495*   (2006.01)
*H01L 21/00*   (2006.01)

(52) U.S. Cl.
CPC ...... *H01L 21/4828* (2013.01); *H01L 23/49582* (2013.01); *H01L 21/00* (2013.01); *H01L 2924/0002* (2013.01)

USPC .......................................... 438/677; 438/460

(58) Field of Classification Search
USPC ................... 257/677; 438/670, 460
See application file for complete search history.

(56) References Cited

U.S. PATENT DOCUMENTS 7,294,521 B2 * 11/2007 Yoo ................................. 438/46
2012/0248458 A1 * 10/2012 Cho et al. ....................... 257/76

FOREIGN PATENT DOCUMENTS

| JP | A-2010-171420 | 8/2010 |
| JP | A-2010-251736 | 11/2010 |
| WO | WO 2011/055462 A1 | 5/2011 |

\* cited by examiner

*Primary Examiner* — Roy Potter
(74) *Attorney, Agent, or Firm* — Oliff PLC

(57) ABSTRACT

A method of manufacturing, at a reduced cost, a semiconductor device assembly and a semiconductor device, having a conductive support which is not eroded by an etchant for a lift-off layer even when the lift-off layer is made of a material for which no suitable selective etching solution has been found is provided. In the method of manufacturing the semiconductor device assembly, a plating step of forming a conductive support is carried out such that a first metal which is dissolved with an etchant is encapsulated in second metal which are not dissolved with the etchant, and through-holes for supplying etchant are formed in the second metal.

13 Claims, 6 Drawing Sheets

(a)

(b)

(c)

(d)

(e)

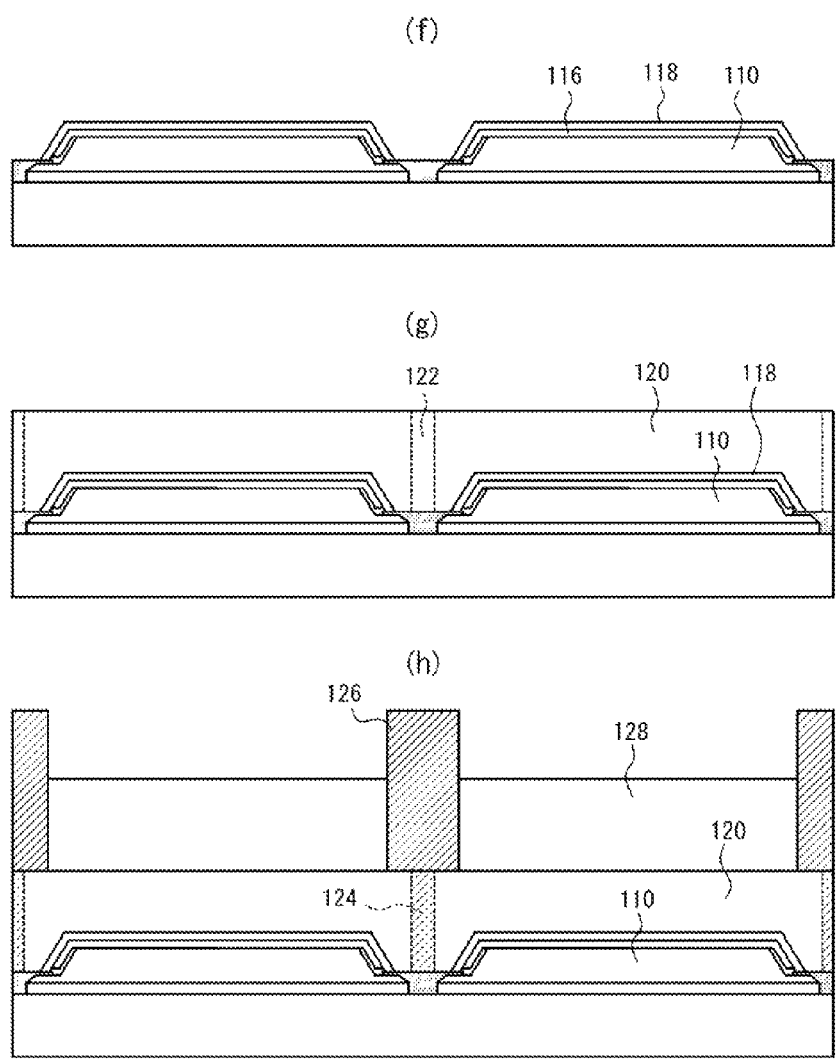

(i)

(j)

SEMICONDUCTOR DEVICE ASSEMBLY AND SEMICONDUCTOR DEVICE AND METHOD OF MANUFACTURING THE SAME

TECHNICAL FIELD

The present invention relates to a semiconductor device assembly, a semiconductor device, and a method of manufacturing the same, and particularly relates to a method of manufacturing a semiconductor device assembly using a chemical lift-off process.

BACKGROUND ART

Examples of semiconductor devices include field effect transistors (FETs), light emitting diodes (LEDs), and the like. For LEDs, for example, Group III-V semiconductors made of compounds of Group III and Group V elements are used.

A Group III nitride semiconductor using Al, Ga, In, or the like as a Group III element and using N as a Group V element has a high melting point and a high dissociation pressure of nitrogen, which makes it difficult to perform bulk single crystal growth. Further, no inexpensive conductive single crystal substrates having large diameter are available; therefore, such a semiconductor is typically formed on a sapphire substrate.

However, the sapphire substrate has an insulation property; accordingly, electric current does not flow in the substrate. Therefore, a light emitting diode conventionally used to have a lateral structure in which electric current flows in a lateral direction. This structure is obtained by partially removing a semiconductor laminate formed by sequentially growing an n-type Group III nitride semiconductor layer, an active layer (light emitting layer), and a p-type Group III nitride semiconductor layer on a sapphire substrate, to expose the n-type Group III nitride semiconductor layer, and providing an n-type electrode and a p-type electrode on the exposed n-type Group III nitride semiconductor layer and the p-type Group III nitride semiconductor layer, respectively.

In response to this, in recent years, the following techniques for obtaining vertical structure LED chips have been studied. After forming a buffer layer made of a certain element other than a Group III element (for example. Al, Ga, or the like) on a sapphire substrate, a semiconductor laminate including a light-emitting layer is formed. The semiconductor laminate is supported by a conductive support, and then a sapphire substrate is separated (lifted-off) by selectively dissolving the buffer layer by chemical etching. The conductive support and the semiconductor laminate are sandwiched between a pair of electrodes. Note that a "buffer layer" herein is a buffer layer for epitaxial growth of a semiconductor laminate, which also serves as a lift-off layer for separating the semiconductor laminate from a sapphire substrate.

In manufacturing a III nitride semiconductor LED chip having such a structure, a chemical lift-off process is used in which process an epitaxial layer is separated from a sapphire substrate by etching a lift-off layer with a certain etchant. This can be described in other words as "a growth substrate is lifted-off from an epitaxial layer".

A method using CrN as a lift-off layer has been reported (PTL 1). Patent Document 1 discloses a method of manufacturing vertically structured Group III nitride semiconductor LED chips, including the steps of forming a plurality of light emitting structures made of a Group III nitride on a sapphire substrate with a lift-off layer made of CrN provided therebetween; forming a conductive support for integrally supporting these light emitting structures by Cu plating; separating the substrate from the light emitting structures by removing the lift-off layer by supplying an etchant by way of through-holes provided in the conductive support; and cutting the conductive support between the light emitting structures to singulate the plurality of the light emitting structures to obtain LED chips.

Meanwhile, techniques of forming a lift-off layer of a material other than CrN are being developed. For example, Patent Document 2 discloses a technique of using a single metal layer made of Zr or Hf as a lift-off layer, whereas Patent Document 3 discloses a technique of using a scandium nitride (ScN) film as a lift-off layer. The reason for using a material other than CrN as a lift-off layer is to obtain LED chips emitting a light with a shorter wavelength than that of blue light (for example, a wavelength of 400 nm or less). Specifically, as the wavelength of light to be generated is shorter, the Al content x in an $Al_xGa_{1-x}N$ layer of the nitride semiconductor element is required to be higher. The growth temperature of AlGaN having an Al content which exceeds about 30 at. % is higher than about 1050° C., the melting point of CrN. Accordingly, when an AlGaN layer having such a high Al content is grown on a CrN layer, CrN melts under a high temperature environment. As a result, CrN is unevenly distributed on the sapphire substrate, and the AlGaN layer is partially grown directly on the sapphire substrate. Thus, it becomes difficult to perform chemical lift-off. On the other hand, when a material described in PTL 2 or PTL 3 is used as a lift-off layer, growth of high Al content AlGaN having a high growth temperature does not cause the melt of the lift-off layer. Thus, LED chips emitting a light with a short wavelength can be obtained by removing the lift-off layer.

CITATION LIST

Patent Literature

PTL 1: WO 2011/055462
PTL 2: JP 2010-171420 A
PTL 3: JP 2010-251736 A

SUMMARY OF INVENTION

Technical Problem

For a lift-off layer made of CrN, a selective etching solution capable of etching only CrN, for example, a diammonium cerium(IV) nitrate solution, a potassium ferricyanide-based solution, or the like can be used. However, for a lift-off layer made of a material other than CrN, for example, Zr, Hf, or ScN described in Patent Document 2 and 3, the lift-off layer has been removed using a hydrofluoric acid-based etchant or an acid etching solution such as hydrochloric acid, nitric acid, organic acid or the like. Although a Group III nitride layer is resistant to those etchants, when a conductive support is formed of Cu by plating, for example, these etchants dissolves not only the lift-off layer but also the conductive support made of Cu. As such, highly conductive and relatively inexpensive metal materials such as Cu are also low in acid resistance. Therefore, suitable LED chips could not have been obtained.

Further, when the conductive support is formed of Au or a platinum group metal by plating, the support is not dissolved by the above acid etching solution. Accordingly, LED chips can be obtained by removing only the lift-off layer. However, when the conductive support is made solely of Au or a platinum group metal, the material cost is high, which is not preferable.

Such problems are important challenges to be overcome in order to realize mass production of not only vertically structured Group III nitride semiconductor LED chips but also any semiconductor device manufactured using the chemical lift-off process, in terms of ensuring flexibility in selecting the material of the lift-off layer.

In view of the above problems, it is an object of the present invention to provide a method of manufacturing, at a reduced cost, a semiconductor device assembly and a semiconductor device, having a conductive support which is not eroded by an etchant for a lift-off layer even when the lift-off layer is made of a material for which no suitable selective etching solution has been found. Further, another object of the present invention is to provide a semiconductor device assembly and a semiconductor device that are manufactured as described above.

Solution to Problem

In order to achieve the above objects, the present invention primarily includes the following features.

(1) A method of manufacturing a semiconductor device assembly, comprising: a step of forming a lift-off layer and a semiconductor layer in this order on a growth substrate; a step of partially removing the semiconductor layer to form grooves in the bottom of which the growth substrate or the lift-off layer is partially exposed, thereby forming a plurality of separate semiconductor structures; a plating step of forming a conductive support for integrally supporting the plurality of the semiconductor structures by plating; and a chemical lift-off step of separating the growth substrate from the plurality of semiconductor structures by removing the lift-off layer using a given etchant, wherein the plating step is performed such that a first metal which can be dissolved in the etchant is encapsulated in a second metal which are not dissolved in the etchant in the conductive support, and through-holes communicating with the grooves are formed in the second metal, and the etchant is supplied to the grooves through the though holes in the chemical lift-off step.

(2) The method of manufacturing a semiconductor device assembly according to (1) above, wherein the plating step comprises the steps of forming a first plating layer made of the second metal on the semiconductor structures; forming a second plating layer made of the first metal partially on the first plating layer; and forming a third plating layer made of the second metal on the second plating layer and part of the first plating layer where the second plating layer is not formed.

(3) A method of manufacturing a semiconductor device assembly according to (2) above, wherein the second plating layer is formed in the form of an island above each of the plurality of the semiconductor structures.

(4) The method of manufacturing a semiconductor device assembly according to (2) or (3) above, wherein the first plating layer and the third plating layer are made of the same kind of metal.

(5) The method of manufacturing a semiconductor device assembly according to any one of (1) or (2) above, wherein the plating step is performed in a state where resists are buried in regions where the through-holes are to be formed.

(6) The method of manufacturing a semiconductor device assembly according to any one of (1) or (2) above, wherein the first metal is Cu or Ni.

(7) The method of manufacturing a semiconductor device assembly according to any one of (1) or (2) above, wherein the second metal is Au or a platinum group metal.

(8) A method of manufacturing a semiconductor device, comprising the step of: cutting the conductive support between the semiconductor structures of a semiconductor device assembly obtained by the method of manufacturing a semiconductor device assembly according to any one of (1) or (2) above to singulate the plurality of semiconductor devices each having the semiconductor structures supported by the cut conductive support.

(9) A semiconductor device assembly comprising a conductive support and a plurality of separate semiconductor structures thereon integrally supported by the conductive support, wherein the conductive support includes a first metal made of Cu or Ni and second metal made of Au or a platinum group metal, which encapsulate the first metal, and the conductive support has through-holes in the second metal at the position where the second metal do not support the semiconductor structures.

(10) The semiconductor device assembly according to (9) above, wherein the second metal is disposed in the form of an island above each of the plurality of the semiconductor structures.

(11) A semiconductor device comprising a conductive support and a semiconductor structure provided on the conductive support, wherein the conductive support includes a first metal made of Cu or Ni and a second metal made of Au or a platinum group metal, which encapsulates the first metal, and the conductive support has grooves extended in the thickness direction on side surfaces of the conductive support, which are made of the second metal.

Note that "being dissolved" herein comprehends not only reduction in the volume but also accompanying increase in the resistance of electrical connection that occurs unless the surface is modified by forming a high-resistance oxide film on the surface. In contrast, "being not dissolved" comprehends the situation in which the surface is stable and does not cause any reaction affecting electrical connection. This is because electrical connection is necessary for the conductive support, when the semiconductor device is implemented.

Advantageous Effect of Invention

The present invention provides a conductive support having a structure in which a first metal dissolved by an etchant for removing a lift-off layer is encapsulated in a second metal which is not dissolved by this etchant, and the second metal has a through-hole for supplying the etchant. Therefore, even when the etchant is supplied through the through-hole in a chemical lift-off step, the conductive support is not eroded by the etchant. Further, as compared with a case where the whole conductive support is made of such a second metal, the cost of the conductive support can be reduced.

BRIEF DESCRIPTION OF DRAWINGS

FIGS. 1B(f) to 1B(h) are schematic cross-sectional views illustrating steps of the method of manufacturing a semiconductor device assembly 100 in the embodiment of the present invention that are subsequent to the steps shown in FIGS. 1A(a) to 1A(e).

DESCRIPTION OF EMBODIMENTS

The present invention will be described in more detail below with reference to the drawings. Note that lift-off layers and semiconductor laminates are enlarged in the thickness direction in the schematic cross-sectional views of the semiconductor devices, for the sake of explanations.
(Method of Manufacturing Semiconductor Device Assembly)

A method of manufacturing a semiconductor device assembly 100 according to an embodiment of the present invention will be described with reference to FIGS. 1A to 1D and FIGS. 2(a) to 2(d). First, the correlation between FIGS. 1A to 1D and FIGS. 2(a) to 2(d) will be described. FIG. 2(a) is a schematic top view of the state shown in FIG. 1A(b), and the cross section I-I of FIG. 2(a) corresponds to FIG. 1A(b). The cross-sectional views of FIGS. 1A to 1D other than FIG. 1A(b) also correspond to the same cross section. FIG. 2(b) is a top view of the state shown in FIG. 1B(g). FIG. 2(c) is a top view of the state shown in FIG. 1B(h). FIG. 2(d) is a transverse sectional view of the state shown in FIG. 1C(i).

Figure 1A:
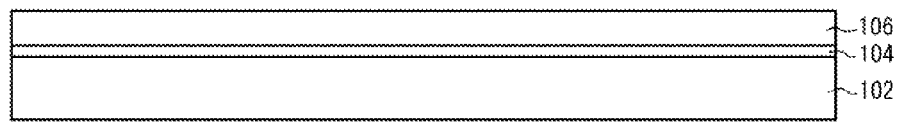
FIGS. 1A(a) to 1A(e) are schematic cross-sectional views illustrating steps of a method of manufacturing a semiconductor device assembly 100 in an embodiment of the present invention.
Figure 1A:
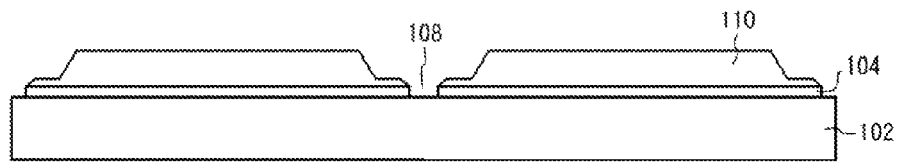
Figure 1A:
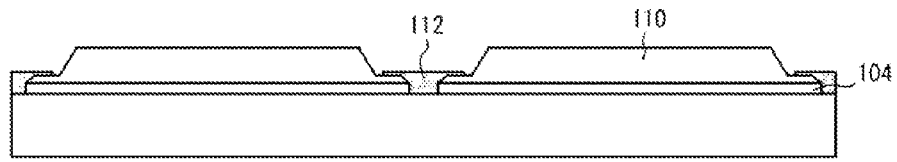
Figure 1A:
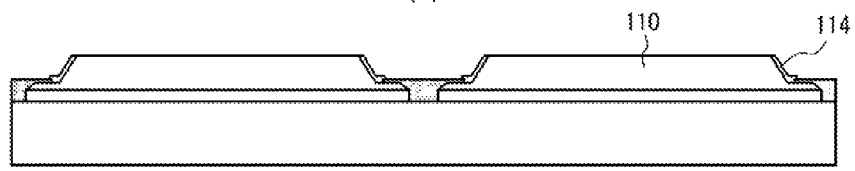
Figure 1A:
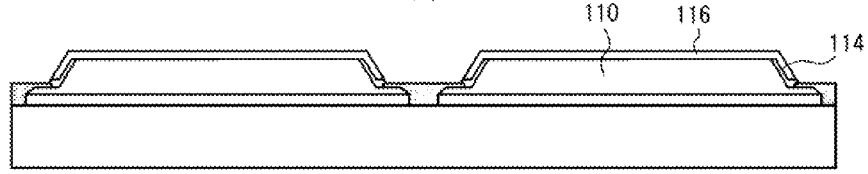
Figure 2:
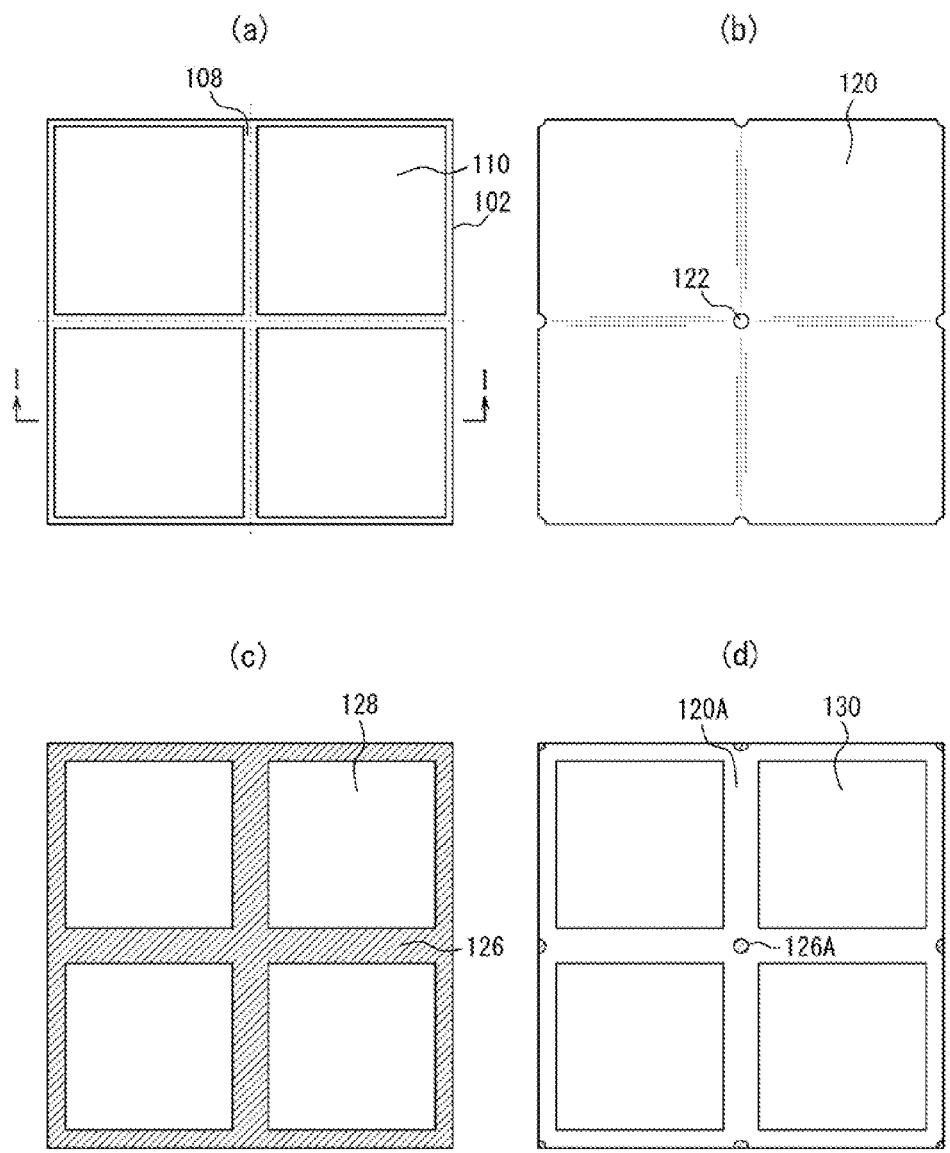
FIGS. 2(a), 2(b), 2(c), and 2(d) are schematic top views of the states shown in FIG. 1A(b), FIG. 1B(g), FIG. 1B(h), and FIG. 1C(i), respectively.

First, a lift-off layer 104 and a semiconductor layer 106 are formed in this order on a growth substrate 102 as shown in FIG. 1A(a). In this embodiment, the lift-off layer 104 is made of ScN.

Next, as shown in FIG. 1A(b) and FIG. 2(a), the semiconductor layer 106 is partially removed to form grooves 108 in a grid pattern such that the growth substrate 102 is partially exposed at the bottom of the grooves 108, thereby forming a plurality of separate semiconductor structures 110. In this embodiment, patterning is performed in two separate steps by reactive ion etching (RE), thereby forming the semiconductor structures 110 having the cross-sectional shape shown in FIG. 1A(b).

In this embodiment, as shown in FIG. 1A(c) a sacrificial layer 112 made of, for example, Ni, Cu, Cr, or W is formed to fill the grooves 108. The sacrificial layer 112 is removed with a certain etchant by way of through-holes to be described later. As a result, a space for supplying the etchant for removing the lift-off layer 104 from the periphery of the semiconductor structures 110 to the lift-off layer 104 is formed.

In this embodiment, as shown in FIG. 1A(d), an insulating film 114 is then formed on side surfaces of each semiconductor structure 110. The insulating films 114 serve to prevent current flowing in the thickness direction in the semiconductor structures 110 from leaking through the side surfaces.

In this embodiment, as shown FIG. 1A (an ohmic electrode layer 116 is then formed directly on the main surface and the side surfaces covered with the insulating film 114 of each semiconductor structure 110.

Next, a plating step for forming a conductive support which integrally supports the plurality of the semiconductor structures 110 by plating is performed.

In this embodiment, as shown in FIG. 1B(f), a plating seed layer 118 is first formed on the semiconductor structure 110 to cover the ohmic electrode layer 116. The plating seed layer 118 has a two-layer structure (Ti/Au) of Ti and Au.

After that, as shown in FIG. 1B(g), Au as a second metal is grown from the Au layer in the plating seed layer 118 by electroplating to form a first plating layer 120 made of Au on the semiconductor structures 110. On this occasion, as also shown in FIG. 2(b), the first plating layers 120 grow in the thickness direction and join each other between adjacent semiconductor structures 110. However, parts of the first plating layers 120 do not join at the corners of each semiconductor structure 110, and the plating growth is terminated such that openings 122 are formed.

After that, as shown in FIG. 1B(h), a second plating layer 128 made of Cu as a first metal is formed partially on the first plating layer 120. Specifically, first, as also shown in FIG. 2(c), a resist 126 is formed partially on the first plating layers 120. At this point, the openings 122 are also filled with resists 124. Subsequently, Cu is grown by electroplating from the exposed parts of the first plating layers 120 which are not covered by the resist 126, thereby forming the second plating layers 128. In this embodiment, as shown in FIG. 1B(h) and FIG. 2(c), the second plating layer 128 is formed in the form of an island above each of the plurality of the semiconductor structures 110.

Figure 1C:
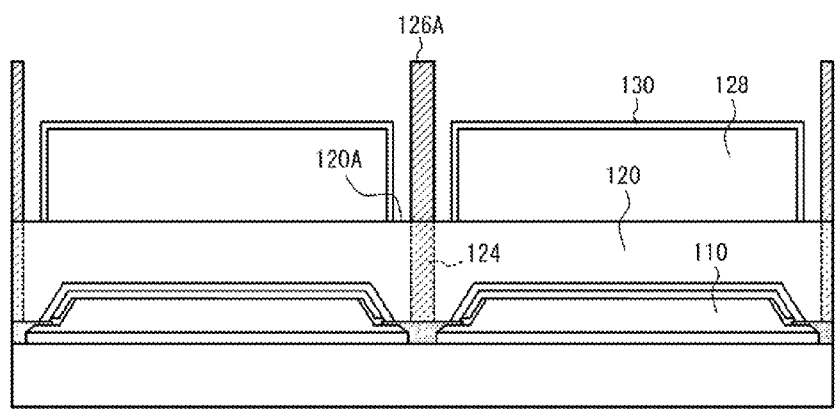
FIGS. 1C(i) and 1C(j) are schematic cross-sectional views illustrating each steps of the method of manufacturing a semiconductor device assembly 100 in the embodiment of the present invention that are subsequent to the steps shown in FIGS. 1B(f) to 1B(h).
Figure 1C:
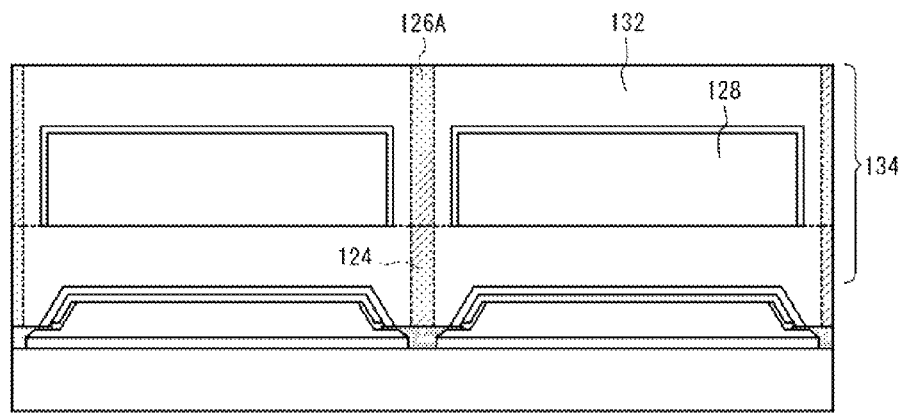

After that, as shown in FIG. 1C(i) and FIG. 2(d), the resist 126 is removed, and columnar resists 126A are newly formed at positions corresponding to the corners of each semiconductor structure 110. At positions the resist 126A as well as the resists 124 in the first plating layer 120 are located, through-holes to be described later will be formed. Further, in this embodiment, A Ni plating layer 130 is formed by growing Ni using electroless plating on the surface of the island-shaped second plating layer 128. This is because Au cannot be grown by plating directly on Cu, but Au can be grown on Ni.

After that, as shown in FIG. 1C(j), Au as the second metal is grown by electroplating on the second plating layer 128 and parts of the first plating layer 120A (shown in FIG. 1C(i) and FIG. 2(d)) on which the second plating layer 128 is not formed, thereby forming a third plating layer 132. Thus, a conductive support 134 having the first metal being encapsulated in the second metal is formed.

Figure 1D:
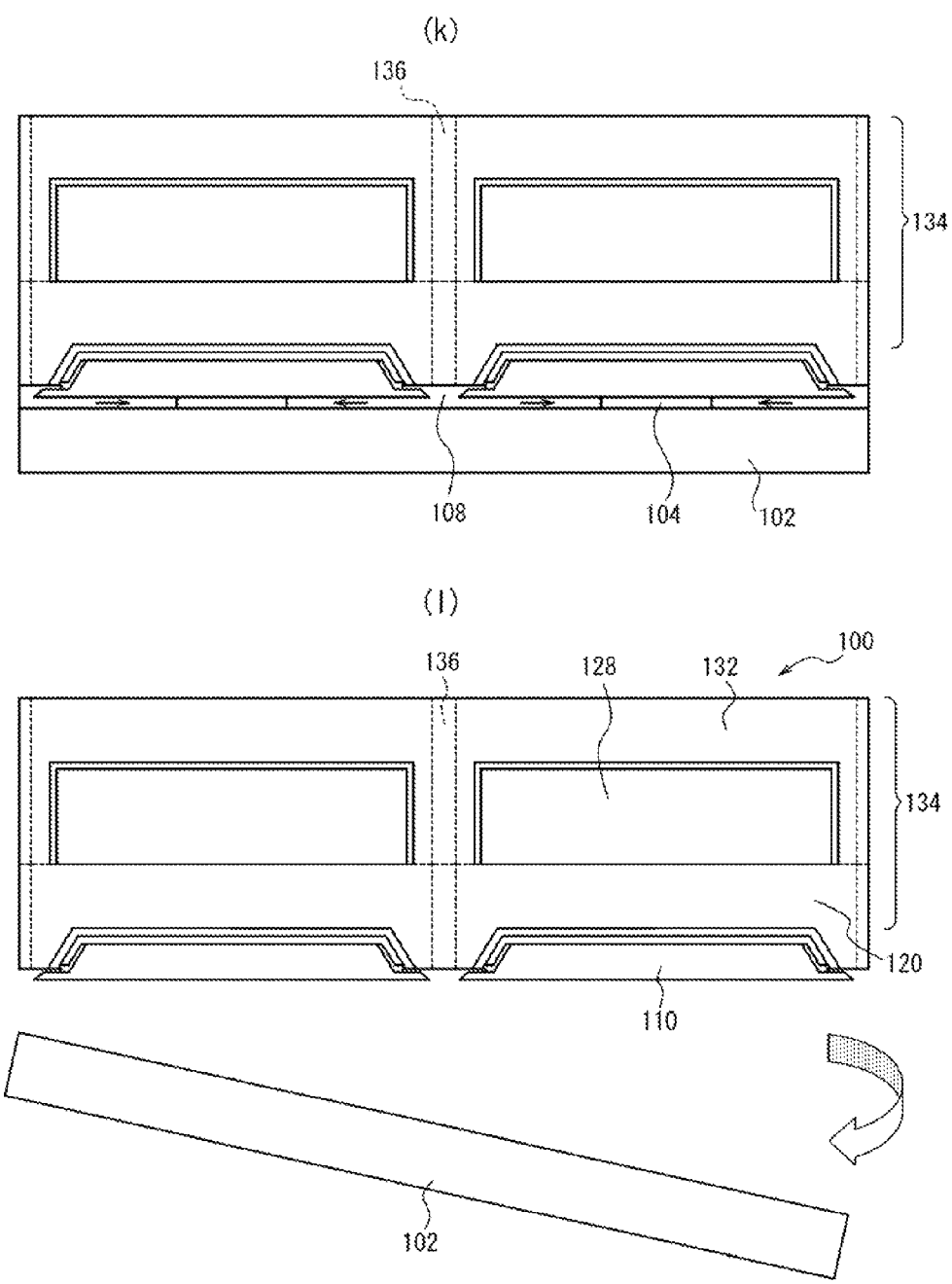
FIGS. 1D(k) and 1D(l) are schematic cross-sectional views illustrating steps of the method of manufacturing a semiconductor device assembly 100 in the embodiment of the present invention that are subsequent to the steps shown in FIGS. 1C(i) and 1C(j).

Then, the resists 124 and 126A are removed thereby forming through-holes 136 as shown in FIG. 1D(k). As such, the plating step is performed in a state where the resists 124 are 126A buried in advance in the regions where the through-holes 136 are to be formed. Subsequently, the sacrificial layer 112 is removed using a certain selective etching solution, thereby forming a space (grooves 108) for supplying the etchant to the lift-off layer 104.

Next, a chemical lift-off step is performed. Specifically, as shown in FIG. 1D(k), the whole wafer is dipped in a predetermined etchant, and this etchant is supplied to the grooves 108 through the through-holes 136, thereby removing the lift-off layer 104. In this embodiment, in order to remove the lift-off layer 104 made of ScN, an acid etching solution such as hydrochloric acid, nitric acid, or organic acid is used. Thus, as shown in FIG. 1D(l), the growth substrate 102 can be separated from the plurality of the semiconductor structures 110.

A semiconductor device assembly 100 is manufactured as described above. Here, Cu employed as the first metal is more or less dissolved in the above acid etching solution for removing the lift-off layer 104, whereas Au employed as the second metal is not dissolved in the acid etching solution. Specifically, as a result of the plating step shown in FIG. 1B(f) to FIG. 1D(k), the conductive support 134 is formed such that the first metal 128 which is dissolved in the etchant is encapsulated in the second metal 120 and 132 which are not dissolved in the etchant, and the through-holes 136 communicated with the grooves 108 are formed in the second metal 132, as shown in FIG. 1D(k) and FIG. 1D(l). This constitutes a characteristic step of the present invention.

The technical meaning of employing such a characteristic step will be described with the operation and effect. In this embodiment, surfaces of the conductive support 134, including the inner surfaces of the through-holes 136 are all made of Au or a platinum group metal. Therefore, even when an acid etching solution such as hydrochloric acid is supplied through the through-hole 136 in the chemical lift-off step, the conductive support 134 is not eroded by the etchant. Further, the conductive support 134 has a portion made of Cu which is less expensive than Au and platinum group metal. As a result, as compared with a case where the whole conductive support is made of Au or a platinum group metal, the cost of the conductive support can be reduced. When a metal which is not dissolved in an acid solution, that is, the second metal having high resistance to acid is compared with the first metal which is dissolved in an acid solution, the former is generally more expensive than the latter. For this reason, the second metal is provided on parts of the conductive support 134 which may be in contact with the etchant, whereas the first metal is provided on parts thereof which would not be in contact with the etchant. Thus, both sufficient resistance of the conductive support to corrosion due to the etchant and reasonable cost should be achieved.

Note that in the present invention, the first metal need be encapsulated in the second metal at least in the above chemical lift-off step, but the first metal may be partially exposed at the cut section after the step of cutting the conductive support 134 between the semiconductor structures 110 to be described later. However, in order to improve the weather resistance of the semiconductor devices, the first metal is preferably encapsulated in the second metal even after the cutting step. In other words, the electrical coupling between the semiconductor structures 110 which is necessary for electrical conduction in electroplating may be made by the plating seed layers and the first plating layer, whereas the second plating layer may be formed by plating in closed regions on the semiconductor structures 110 isolated by the resist formed in portions to be cut.

(Step of Forming Semiconductor Layer)

A sapphire substrate or an AlN template substrate in which an AlN film is formed on a sapphire substrate is preferably used as the growth substrate 102. The selection may be made depending on the kind of a lift-off layer to be formed, the composition of Al, Ga, and In of the semiconductor laminate made of a Group III nitride semiconductor, the quality and cost of LED chips, and the like.

The lift-off layer 104 is not limited in particular as long as its material can be dissolved in the etchant, for example, it may be a buffer layer made of a metal other than Group III metal, such as CrN, or a nitride of such a metal. It should be noted that advantageous effects of the present invention can be favorably achieved when a material for which no suitable selective etching solution has been found is used. Examples of such a material include, for example, Hf, Zr, ScN, and TiN. The lift-off layer 104 can be formed by sputtering, vacuum deposition, ion plating, or MOCVD (Metal Organic Chemical Vapor Deposition). Typically, the thickness of the lift-off layer 104 is around 2 nm to 100 nm.

The materials and the layer structure of the semiconductor layer 106 are not limited in particular as long as the semiconductor device is manufactured by a chemical lift-off process. The semiconductor layer may have a single layer or may have two or more layers. If the semiconductor structure includes a light emitting layer, it is a LED, and if not, it is another type of semiconductor device. The semiconductor layer 106 can be epitaxially grown on the lift-off layer 104 for example by MOCVD. Typically, the thickness of the semiconductor layer 106 is around 0.5 μm to 50 μm. For example, when the semiconductor layer is made by sequentially stacking a Group III nitride semiconductor layer having a first conductivity type, a light emitting layer, and a Group III nitride semiconductor layer having a second conductivity type which is different from the first conductivity type on the lift-off layer 104, the semiconductor device of the present invention can be obtained as a vertical structure Group III nitride semiconductor LED chip. In this case, the first conductivity type and the second conductivity type may be n-type and p-type, respectively or opposite thereto. Further, the semiconductor layer 106 may be made of for example an AlInGaN-based or AlInGaPAs-based Group III-V material or a Group II-VI material such as ZnO.

(Step of Forming Grooves)

It is preferable to employ dry etching for partially removing the semiconductor layer 106. This is because dry etching makes it possible to reproducibly control end points of etching of the semiconductor layer 106. The lift-off layer 104 cannot be etched with the etchant in a later step if the semiconductor layers 106 are joined to each other. Accordingly, the partial removal of the semiconductor layer is performed at least until the growth substrate or the lift-off layer is exposed. This embodiment described above presents an example of removing the lift-off layer 104 at the bottom of the grooves 108 to expose the whole growth substrate 102.

In this embodiment, the shape of the transverse cross section of the semiconductor structures 110 is a quadrangle. However, the shape of the semiconductor structures 110 is not limited in particular, and the shape may be a circle or a polygon. Note that, in a step of singulating semiconductor devices, the semiconductor structures 110 are preferably arranged in a matrix so that the simulation can be done by straight cutting along the grooves 108 using a laser dicing apparatus or the like.

When the semiconductor structures 110 have a quadrangular transverse cross section, the length of one side of each semiconductor structure is not limited in particular, and the length may be around 250 μm to 3000 μm. Further, the width of straight portions of the grooves 108 is preferably in the range of 40 μm to 200 μm, and more preferably in the range of 60 μm to 100 μm. The width of 40 μm or more allows the etchant to be supplied to the grooves 108 smoothly enough, whereas the width of 200 pin or less allows the loss of light emitting area to be minimized.

The sacrificial layer 112 is made of a different material from the second metal and the plating seed layers 118, and the material of the sacrificial layer 112 can be selected from materials such as metals or resins which can be removed with an etchant which does not etch these metals. For example, metals such as Ni, Cu, Cr, or W can be used. For example, the sacrificial layer 112 is formed to 0.1 μm to 0.3 μm by sputtering W, and patterning using normal photolithography. The sacrificial layer 112 may be removed using a selective etching solution suitable for the material. For example, an acid etching solution such as hydrogen peroxide solution, hydrochloric acid, nitric acid, or organic acid, or diammonium cerium (IV) nitrate solution, or the like can be used.

For the insulating film 118, for example SiO$_2$ or SiN can be used. The insulating film is formed by plasma-enhanced CVD to a thickness of 100 nm to 500 nm. Alternatively, electron beam (EB)-induced deposition or the like may be used for the film formation.

The ohmic electrode layers 116 can be formed of a high work function metal, for example, a noble metal such as Pd, Pt, Rh, Au, or Ag; or Co or Ni. Further, an additional reflective layer is preferably formed between the ohmic electrode layer 116 and the plating seed layer 118; alternatively, the ohmic electrode layer 116 preferably also serves as a reflective layer. These layers can be formed by a dry film formation method such as vacuum vapor deposition, ion plating, or sputtering. The reflective layers are preferably made of Rh or the like which has high reflectivity, and the reflective layer made of such a material can be used also as an ohmic electrode layer. When the emission wavelength is in the visible range, layers of Ag or Al, or the like are preferably used. When the emission wavelength is in the ultraviolet range, layers of Rh or Ru, or the like are preferably used.

(Plating Step)

The conductive support 134 can serve also as a lower electrode. The conductive support 134 is mainly formed by wet plating such as electroplating or electroless plating. However, part of the conductive support 134 and the plating seed layers are formed by vacuum deposition or sputtering.

The layer constituting the plating seed layer 118 on the growth substrate side (semiconductor structures side) is preferably made of a metal having sufficient adhesion to the ohmic electrode layer 116, for example Ti. Further the surface layer constituting the plating seed layer 118 (on the conductive support 134 side) may be made of a material selected from Au and platinum group metals. When these metals are used for the plating seed layer 118, the plating seed layer is not dissolved even when brought into contact with the etchant for removing the lift-off layer; thus, the conductive support 134 can be prevented from peeling. Note that the thickness of the layer made of Ti and the thickness of the layer made of Au or a platinum group metal are around 10 nm to 100 nm and around 100 nm to 200 nm, respectively, and these layers are formed by vacuum deposition or sputtering.

FIG. 1B(f) shows an example of forming the plating seed layers 118 only on the ohmic electrode layers 116. However, when an insulator such as a resin is selected as a material of the sacrificial layer 112, the plating seed layers 118 may be arranged such that the individual semiconductor structures 110 are partially joined to each other by the plating seed layers 118 on the sacrificial layer. This ensures a current path used in plating.

The first metal (the second plating layer) 128 may be Cu or Ni. These metals are not only low in cost but also excellent in terms of productivity, since films made of these metals can be formed at a high film formation rate by electroplating. The thickness of the film made of first metal can be in the range of 80 μm to 200 μm. Further, the length of one side of the second plating layer 128 shown in the top view of FIG. 2(c) can be around 90 to 98% of the length of one side of each of the semiconductor structures 110. Further, as in this embodiment, the second plating layer 128 is preferably formed in the form of an island above each of the plurality of the semiconductor structures 110, so that the first metal is not exposed on the surface of the conductive support even after singulation. This is because exposure of the first metal would result in problems in terms of weather resistance of the devices, such as corrosion.

The second metal 120 and 132 may be Au or a platinum group metal such as Rh or Pd. This is because these metals are very stable, and are not dissolved in the above described acid etching solution. In addition, the first plating layer 120 and the third plating layer 132 may be made of different materials; however, the same material is preferably used. The first plating layer and the third plating layer have to cover the whole second plating layer 128. The thickness of the first plating layer 120 may be around 5 μm to 20 μm, and the thickness of parts of the third plating layer 132 on the second plating layer may be around 5 μm to 20 μm. These ranges are set so that pinholes can be prevented from remaining in the first and the third plating layers, thereby completely preventing the second plating layer from being dissolved by the etchant used in the chemical lift-off step.

When Au is used as the second metal, a non-cyanide (gold sulfite-based) solution is preferably used as Au plating solution.

The Ni plating layers 130 are layers provided to perform plating on Cu with the second metal. The thickness of the Ni plating layers may be around 3 μm to 9 μm, and they are formed by electroless plating (typically using a solution with a low to medium content of phosphorous) or electroplating. When the second plating layer 128 is made of Ni, the Ni plating layer 130 may be omitted.

In Cu electroplating, a co-called copper sulfate bath is generally used, and the solution temperature is around 23° C. to 30° C., and the cathode current density is 2 A/dm$^2$ to 5 A/dm$^2$. The current density and plating time are adjusted to achieve the desired thickness. In order to ensure favorable surface flatness and glossiness of the plating film, organic additives for printed circuit boards or semiconductor bumps are suitably selected to be used. Further, air bubbling is used to stir the solution.

In Au electroplating, in order to reduce burdens such as liquid waste treatment, the plating is done using a gold sulfite-based plating solution having an almost neutral pH at a solution temperature of 57° C. to 62° C. and a cathode current density of 0.5 A/dm$^2$ to 2.0 A/dm$^2$. The current density and plating time are adjusted to achieve a desired thickness. Jet plating is employed as a method for supplying plating solution to effectively supply plating solution components to the solid-liquid interface.

The dimensions and the shape of the through-holes 136 are not limited in particular, as long as the etchant can reach the grooves 108 (space). For example, the through-holes can have a rectangular or circular shape with a side length or a diameter of 40 μm to 100 μm. Further, the materials of the resists 124 and 126 may be suitably selected from materials produced by TOKYO OHKA KOGYO CO., LTD. or JSR Corporation that are commercially available and ready for Cu plating or Au plating. Resist removal is performed using a solution which can dissolve a resist resin such as for example acetone. Ultrasonic waves may be used in combination, and the solution may be heated to a temperature equal to or lower than the boiling point.

Note that the positions of the through-holes 136 are not limited to the portions above the intersections of the grooves 108, and alternatively may be positions allowing communication with the grooves 108. When providing the through-holes 136 above regions other than the intersections of the grooves 108, resist pillars are formed at portions in the first plating layer, which are to be the through-holes prior to the formation of the first plating layer 120 in FIG. 1B(g).

(Chemical Lift-Off Step)

Etchants that can be used for the chemical lift-off process in the present invention are not limited in particular. When the lift-off layer is made of CrN, an etchant having selectivity on CrN, such as a diammonium cerium(IV) nitrate solution or a potassium ferricyanide-based solution can be used. When the lift-off layer is made of ScN, an acid etching solution such as hydrochloric acid, nitric acid, or organic acid can be used. Further, when the lift-off layer is made of Zr or Hf, a hydrofluoric acid-based etchant such as BHF can be used. These acid etching solutions even erode a conductive support depending on its material. Accordingly, advantageous effects of the present invention can be favorably achieved when using these acid etching solutions.

Further, surfaces of the semiconductor structures 110 that have been exposed after the lift-off are preferably rinsed by wet cleaning. Subsequently, the semiconductor structures 110 can be etched for a predetermined amount by dry etching and/or wet etching.

Further, bonding pad electrodes and n-type ohmic electrodes as upper electrodes are formed by lift-off using the resists as masks. Al, Cr, Ti, Ni, Pt, Au, or the like is used as an electrode material. Ti, Pt, Au, or the like is deposited as cover layers on the ohmic electrodes and the bonding pads to reduce wiring resistance and improve adhesion of the wire bonding. Note that the exposed surfaces of the semiconductor structures 110 (except for the bonding pad surfaces may be provided with protective films made of $SiO_2$, SiN, or the like.

(Semiconductor Device Assembly)

FIGS. 3(a) to 3(d) show a semiconductor structure assembly 100 according to the present invention, which can be obtained by the above described manufacturing method. The surfaces of exposed semiconductor structures 110 are trimmed for a predetermined amount and are flattened after the state shown in FIG. 1D(l). The semiconductor device assembly 100 has a conductive support 134 and a plurality of the separate semiconductor structures 110 thereon integrally supported by the conductive support 134. Further, the conductive support 134 includes a first metal 128 made of Cu or Ni and second metal 120 and 132 made of Au or a platinum group metal, which encapsulate the first metal 128, and the conductive support 134 has through-holes 136 at portions of the second metal 120 and 132, which do not support the semiconductor structures. Such a semiconductor device assembly 100 is preferable because the conductive support 134 is not eroded by the etchant used for removing the lift-off layer. Further, as compared with a case where the whole conductive support is made of a second metal such as Au, the cost of the conductive support can be reduced. As appreciated from the above, "semiconductor device assembly" herein means a wafer in which a plurality of separate semiconductor structures integrally supported by a conductive support, and a substrate on which a semiconductor layer is grown is separated.

The side surfaces of the semiconductor structures 110 are covered with the insulating film 114. Further, the ohmic electrode layer 116 and the plating seed layer 118 are provided on the semiconductor structures 110. The Ni plating layer 130 is provided between the second plating layer 128 and the third plating layer 132.

Further, the second metal 128 is preferably disposed in the form of an island above each of the plurality of the semiconductor structures 110. This is because the first metal is not exposed on the surface of the conductive support even after singulation of the semiconductor structures 110.

(Method of Manufacturing Semiconductor Device)

Figure 3:
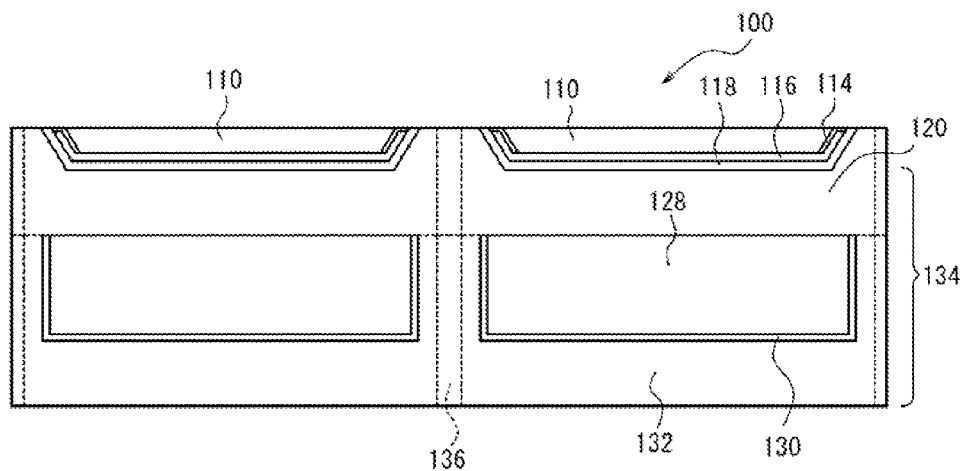
FIG. 3 is a schematic cross-sectional view of a semiconductor device assembly 100 of an embodiment of the present invention.
Figure 4:
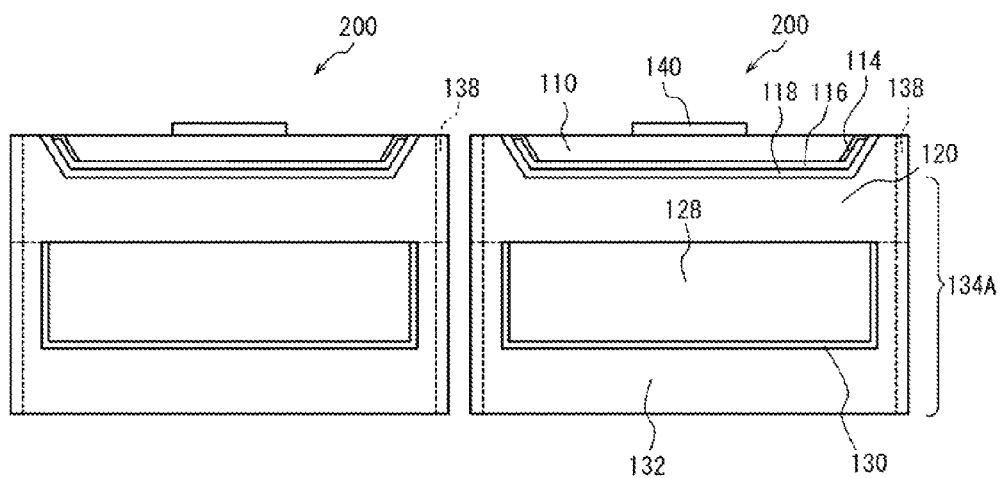
FIG. 4 is a cross-sectional view of singulated semiconductor devices 200 of an embodiment of the present invention.

By cutting the conductive support between the semiconductor structures of the semiconductor device assembly 100 obtained by the above manufacturing method (FIG. 3), as shown in FIG. 4, the plurality of semiconductor devices 200 each having the respective semiconductor structures 110 supported by the cut conductive supports 134A are singulated. Note that the upper electrode 140 is formed on the semiconductor structure 110. The cutting is carried out along the broken lines shown in FIG. 2(a) using, for example, a blade dicer or a laser dicer.

(Semiconductor Device)

The semiconductor device 200 according to the present invention which can be obtained by such a method will be described with reference to FIG. 4. The semiconductor device 200 has a conductive support 134A and a semiconductor structure 110 provided on the conductive support 134A. Further, the conductive support 134A includes a first metal 128 made of Cu or Ni and second metal 120 and 132 made of Au or a platinum group metal, which encapsulate the first metal 128, and the conductive supports 134A have grooves 138 extended in the thickness direction on side surfaces of the conductive supports 134A, which are made of the second metal 120 and 132. The grooves 138 come from the through-holes 136 for supplying etchant. Such a semiconductor device 200 is preferable because the conductive support 134A is not eroded by the etchant used for removing the lift-off layer. Further, as compared with a case where the whole conductive support is made of a second metal such as Au, the cost of the conductive support can be reduced.

In the semiconductor device 100, the conductive support 134A functions as a lower electrode to be paired with the upper electrode 140 provided on the semiconductor structure 110. Note that the insulating film 114, the ohmic electrode 116, the plating seed layer 118, and the Ni plating layer 130 are as described above.

The above shows examples of representative embodiments, and the present invention is not limited to those embodiments. Accordingly, suitable modifications can be made to the present invention unless departing from the scope of the claims.

EXAMPLE

LED chips shown in FIG. 3 were manufactured by the method shown n FIGS. 1A to 1D and FIGS. 2(a) to 2(d). Specifically, an AlN single crystal layer (thickness: 1 μm) was formed on a sapphire substrate by MOCVD to form an MN (0001) template. On this growth substrate, Sc was deposited (thickness: 15 nm) by sputtering, and the deposited Sc was then nitrided in an MOCVD apparatus, thereby forming a ScN layer as a lift-off layer. The nitriding process was performed under the conditions of a pressure of 200 Torr at 1150° C., for 10 minutes in an ammonia gas atmosphere.

After that, a 1 μm-thick AlN layer was then grown as a semiconductor layer on the lift-off layer, followed by growth of an n-type AlGaN cladding layer (thickness: 2.5 μm), a MQW (multiple quantum well) light emitting layer of AlInGaN/AlGaN, a p-AlGaN electron blocking layer, and a p-AlGaN cladding/contact layer (thickness: 0.25 μm) in the same MOCVD apparatus, thus obtaining an epitaxial substrate having a UV-LED structure.

The semiconductor layer was then partially removed by dry etching to partially expose the sapphire substrate to form grooves in a grid pattern, thereby forming a plurality of separate island-like semiconductor structures each having a square transverse cross section. The width W of each of the semiconductor structures was 1000 μm, and the devices were arranged in a matrix. The pitch between the devices was 1150 μm; accordingly, the groove width was 150 μm.

After that, a sacrificial layer made of Cr was formed (thickness: 300 nm) by sputtering to fill the grooves. Insulating films (SiO$_2$ films, thickness: 250 nm) were then formed on the side surfaces of the semiconductor structures by plasma-enhanced CVD. Further, ohmic electrode layers (Rh, thickness: 100 nm) were formed thereon by sputtering.

Subsequently, plating seed layers (Ti/Au, thicknesses: 20 nm/200 nm) were formed by sputtering to cover the ohmic electrode layers. Moreover, first plating layers made of Au was formed (thickness at a position on the semiconductor layer: 15 µm) on the plating seed layers. At that point of time, openings formed at the corners of each of the semiconductor structures had a circular shape with a diameter of approximately 110 µm. The plating was carried out under the conditions of using a gold sulfite-based plating solution having an Au ion content of 16 g/L, at a solution temperature of 60° C., at a cathode current density of 1.6 A/dm$^2$ for a plating time of 15 minutes.

Next, a resist (thickness: 120 µm) was applied to the first plating layer, and was patterned into the shape shown in FIG. 2(c). The length of one side of each part on which the resist was removed was 970 µm. At this time, the openings in the first plating layer were also filled with the resist. After that, second plating layers made of Cu were formed (thickness: 105 µm) on the first plating layers exposed without being covered with the resist. Note that plating was carried out using a copper sulfate plating bath described above at a solution temperature of 25° C. to 28° C., at a cathode current density of 4.0 A/dm$^2$ for about two hours.

Next, the resist on the first plating layers was removed with acetone, and columnar resists were then newly formed solely on the openings in the first plating layer. Subsequently, Ni layers (thickness: 4.5 µm) were formed on the surfaces of the second plating layers by electroless plating. The plating was carried out using a electroless plating solution with a medium content of phosphorous (around 7% P concentration in the plating film) at 75° C. for 30 minutes.

After that, third plating layers made of Au were formed (thickness at a position on the Ni layers: 20 µm) on the Ni layers and the exposed first plating layer. Thus, a conductive supports consisting of the inner Au plating layer and the outer Cu plating layer were successfully formed. On this occasion, the aspect ratio of the second plating layer is higher than that of the semiconductor structure on which the first plating layer is formed; accordingly, the cathode current density was suppressed to 0.8 A/dm$^2$ to avoid lack of the Au plating solution component.

Next, the resist was removed with acetone to form through-holes in the Au plating of the conductive support. After that, the sacrificial layers made of Cr was removed with a diammonium cerium(IV) nitrate solution. Further, an etchant (36 mass % hydrochloric acid) was supplied to the lift-off layer through the through-holes to remove the lift-off layer, thus separating the growth substrate from the semiconductor structures. At that time, Cu part of the conductive support was not brought into contact with the etchant and only Au part thereof was brought into contact with the etchant. Thus, the conductive support was not eroded by the etchant.

After that, the exposed MN layer was partially dry etched to partially expose the n-type AlGaN cladding layer. N-type ohmic electrodes of Ti/Al were then formed on the n-type AlGaN cladding layer, and pad electrodes of Ti/Au were formed thereon. Subsequently, the surface of the parts of the AlN layer which had not been dry etched were etched with an alkaline aqueous solution to form surfaces with submicron scale roughness. Insulating films (SiO$_2$, thickness: 0.2 µm) were formed by plasma-enhanced CVD on the side surfaces and the exposed surfaces of the semiconductor structures, and parts of the insulating films on the pad electrodes were etched away with buffered hydrofluoric acid to expose the pad electrodes.

The conductive support was cut between the semiconductor structures using a laser dicer, thus forming LED chips. Since the conductive support was not eroded by the etchant, the LED chip has no recesses on its section and has a flat surface; that is, the LED was in shape. Further, as compared with a case where the whole conductive support is made of Au, the amount of Au used was lower, which resulted in a significantly advantageous effect in terms of cost.

Comparative Example 1

LED chips were fabricated in the same manner as Example except that the conductive support was made of only Cu. Only the plating step was different from Example, so only the different points will be described below.

The plating seed layers covering the ohmic electrodes were made of Ti/Cu (thicknesses: 20 nm/200 nm). A resist pattern having a thickness of 5 µm was formed to cover the grooves in a grid pattern, thereby forming Cu layers (thickness at a position on the semiconductor layer: 150 µm) on the plating seed layers exposed in the openings. The plating layers joined to each other between the individual semiconductor structures during Cu plating (at a point of growth of about 80 µm), and the growth proceeded with the plating layers being merged. In this case, through-holes were formed by themselves on the intersections of the grooves as shown with 126A in FIG. 2(d). After that, the resist was removed with acetone to form through-holes in the Cu plating of the conductive support. Note that the cathode current density was 4.0 A/dm$^2$ and the plating time was about three hours.

In Comparative Example 1, degassed dilute hydrochloric acid (concentration: 10%) was used in the lift-off step in order to suppress erosion of Cu while etching the ScN lift-off layer. However, the conductive support was eroded by the etchant to be porous or to have many defects.

Comparative Example 2

LED chips were fabricated in the same manner as Example except that the conductive support was made of only Au. Only the plating step was different from Comparative Example 1, so only the different points will be described below.

The plating seed layers covering the ohmic electrodes were made of Ti/Au (thicknesses: 20 nm/200 nm). A resist pattern having a thickness of 5 µm was formed to cover the grooves in a grid pattern, thereby forming Au layers (thickness at a position on the semiconductor layer: 150 µm) on the plating seed layers in which the openings were exposed. The plating layer joined to each other between the individual semiconductor structures during Au plating (at a point of growth of about 80 µm), and the growth proceeded with the plating layers being merged. In this case through-holes were formed by themselves on the intersections of the grooves as shown with 126A in FIG. 2(d). After that, the resist was removed with acetone to form through-holes in the Au plating of the conductive support. For the plating conditions, the kind of plating solution, solution temperature, and the like were as described above, and the cathode current density was 1.3 A/dm$^2$ and the plating time was about three hours.

In Comparative Example 2, the conductive support was made of Au, so that it was not eroded by the etchant. However, the amount of Au used was 2.3 times higher as compared with Example. This was a problem in terms of cost.

INDUSTRIAL APPLICABILITY

The present invention can provide a method of manufacturing, at a reduced cost, a semiconductor device assembly and a semiconductor device, having a conductive support which is not eroded by an etchant for a lift-off layer even when the lift-off layer is made of a material for which no suitable selective etching solution has been found.

REFERENCE SIGNS LIST

100: Semiconductor device assembly
101: Growth substrate
104: Lift-off layer
106: Semiconductor layer
108: Groove
110: Semiconductor structure
120: First plating layer (Second metal)
128: Second plating layer (First metal)
132: Third plating layer (Second metal)
134: Conductive support
134A: Conductive support after cut
136: Through-hole
138: Groove
200: Semiconductor device

The invention claimed is:

1. A method of manufacturing a semiconductor device assembly, comprising:
    a step of forming a lift-off layer and a semiconductor layer in this order on a growth substrate;
    a step of partially removing the semiconductor layer to form grooves in the bottom of which the growth substrate or the lift-off layer is partially exposed, thereby forming a plurality of separate semiconductor structures;
    a plating step of forming a conductive support for integrally supporting the plurality of the semiconductor structures by plating; and
    a chemical lift-off step of separating the growth substrate from the plurality of semiconductor structures by removing the lift-off layer using a given etchant,
    wherein the plating step is performed such that a first metal which can be dissolved in the etchant is encapsulated in a second metal which are not dissolved in the etchant in the conductive support, and through-holes communicating with the grooves are formed in the second metal, and the etchant is supplied to the grooves through the though holes in the chemical lift-off step.

2. The method of manufacturing a semiconductor device assembly according to claim 1, wherein the plating step comprises the steps of:
    forming a first plating layer made of the second metal on the semiconductor structure;
    forming a second plating layer made of the first metal partially on the first plating layer; and
    forming a third plating layer made of the second metal on the second plating layer and part of the first plating layer where the second plating layer is not formed.

3. A method of manufacturing a semiconductor device assembly according to claim 2, wherein the second plating layer is formed in the form of an island above each of the plurality of the semiconductor structures.

4. The method of manufacturing a semiconductor device assembly according to claim 2, wherein the first plating layer and the third plating layer are made of the same kind of metal.

5. The method of manufacturing a semiconductor device assembly according to claim 1, wherein the plating step is performed in a state where resists are buried in regions where the through-holes are to be formed.

6. The method of manufacturing a semiconductor device assembly according to claim 1, wherein the first metal is Cu or Ni.

7. The method of manufacturing a semiconductor device assembly according to claim 1, wherein the second metal is Au or a platinum group metal.

8. A method of manufacturing a semiconductor device, comprising the step of:
    cutting the conductive support between the semiconductor structures of a semiconductor device assembly obtained by the method of manufacturing a semiconductor device assembly according to claim 1 to singulate the plurality of semiconductor devices each having the semiconductor structure supported by the cut conductive support.

9. The method of manufacturing a semiconductor device assembly according to claim 3, wherein the first plating layer and the third plating layer are made of the same kind of metal.

10. The method of manufacturing a semiconductor device assembly according to claim 2, wherein the plating step is performed in a state where resists are buried in regions where the through-holes are to be formed.

11. The method of manufacturing a semiconductor device assembly according to claim 2, wherein the first metal is Cu or Ni.

12. The method of manufacturing a semiconductor device assembly according to claim 2, wherein the second metal is Au or a platinum group metal.

13. A method of manufacturing a semiconductor device, comprising the step of:
    cutting the conductive support between the semiconductor structures of a semiconductor device assembly obtained by the method of manufacturing a semiconductor device assembly according to claim 2 to singulate the plurality of semiconductor devices each having the semiconductor structure supported by the cut conductive support.

* * * * *